(12) United States Patent
Im et al.

(10) Patent No.: US 7,345,516 B2
(45) Date of Patent: Mar. 18, 2008

(54) APPARATUS AND METHOD FOR ADJUSTING SLEW RATE IN SEMICONDUCTOR MEMORY DEVICE

(75) Inventors: Jae-Hyuk Im, Ichon-shi (KR); Kee-Teok Park, Ichon-shi (KR)

(73) Assignee: Hynix Semiconductor, Inc., Kyongki-Do (KR)

( * ) Notice: Subject to any disclaimer, the term of this patent is extended or adjusted under 35 U.S.C. 154(b) by 53 days.

(21) Appl. No.: 11/022,840

(22) Filed: Dec. 28, 2004

(65) Prior Publication Data
US 2005/0231251 A1   Oct. 20, 2005

(30) Foreign Application Priority Data
Apr. 16, 2004   (KR) .................. 10-2004-0026252

(51) Int. Cl.
*H03K 5/12* (2006.01)
(52) U.S. Cl. .................... 327/170; 326/86; 326/87
(58) Field of Classification Search .................. None
See application file for complete search history.

(56) References Cited

U.S. PATENT DOCUMENTS

| 5,822,268 | A | 10/1998 | Kirihata |
| 5,949,732 | A | 9/1999 | Kirihata |
| 6,087,847 | A * | 7/2000 | Mooney et al. ................ 326/30 |
| 6,288,563 | B1 * | 9/2001 | Muljono et al. .............. 326/27 |
| 6,353,346 | B1 * | 3/2002 | Chan .......................... 327/112 |
| 6,366,867 | B2 * | 4/2002 | Sine et al. ................... 702/107 |
| 6,636,069 | B1 * | 10/2003 | Muljono ...................... 326/30 |
| 6,707,316 | B2 | 3/2004 | Afghahi et al. |
| 6,744,287 | B2 * | 6/2004 | Mooney et al. ............. 327/108 |
| 7,035,148 | B2 * | 4/2006 | Chung et al. .......... 365/189.05 |
| 7,053,660 | B2 * | 5/2006 | Itoh et al. ...................... 326/87 |
| 7,068,065 | B1 * | 6/2006 | Nasrullah .................... 326/30 |
| 2004/0164767 | A1 | 8/2004 | Afghahi et al. |

FOREIGN PATENT DOCUMENTS

| JP | 06-096582 | 4/1994 |
| KR | 10-2005-0062036 | 6/2005 |

* cited by examiner

*Primary Examiner*—Tuan T Lam
(74) *Attorney, Agent, or Firm*—McDermott Will & Emery LLP

(57) ABSTRACT

A slew-rate adjusting apparatus for use in a semiconductor memory device includes: a slew-rate modulation signal generator for generating a slew-rate modulation signal according to the number of control codes having a first logic level among a plurality of control codes, which are programmable at an exterior; and a pre-driver for adjusting a slew rate of a data signal by changing the number of switching elements turned on in response to the slew-rate modulation signal.

20 Claims, 6 Drawing Sheets

APPARATUS AND METHOD FOR ADJUSTING SLEW RATE IN SEMICONDUCTOR MEMORY DEVICE

FIELD OF INVENTION

The present invention relates to a semiconductor memory device; and, more particularly, to a high-speed data output buffer of a semiconductor memory device.

DESCRIPTION OF PRIOR ART

A semiconductor memory device includes millions of memory cells and inputs/outputs data to/from the memory cells. The semiconductor memory device has been changed from a synchronous DRAM (SDRAM) to DDR SDRAM and DDR-II SDRAM. However, an operation of refreshing the memory cells has not been changed.

While maintaining the inherent characteristic, a development of the semiconductor memory device will be made for high-speed operation and reduction of a manufacturing cost.

FIG. 1 is a block diagram of a conventional semiconductor memory device.

Referring to FIG. 1, the semiconductor memory device includes a command and address buffer 102, a row decoder 103, a column decoder 104, a DRAM core 105, a data input buffer 107, a data input register 108, a data output register 109, and a data output buffer 110. Since the above elements are apparent to those skilled in the art, a detailed description thereof will be omitted. Instead, only the blocks necessary for the present invention will be described in brief.

The DRAM core 105 includes a DRAM memory cell and a sense amplifier for amplifying a data stored in the DRAM cell. The row decoder 103 and the column decoder 104 select locations corresponding to a command and an address, which are applied from an exterior. Here, the command includes a row address strobe (RAS) signal, a column address strobe (CAS) signal and a write enable (WE) signal, which manage a row access and a column access in a DRAM operation.

If the RAS signal is activated, the row address is inputted at the same time. The row decoder 103 decodes the row address to activate a plurality of memory cells. Then, a slight signal stored in the DRAM cell is amplified by the sense amplifier of the DRAM core 105. That is, the sense amplifier of the DRAM core 105 serves as a data cache that waits for a read operation or a write operation while retaining the amplified data.

In the read operation, if the CAS signal is activated, the column address is decoded at the same time. Then, the sense amplifier serving as the data cache outputs some of data to an internal data bus and the outputted data is stored in the data output register 109. The data stored in the data output register 109 is outputted through the data output buffer 110 after a preset time.

FIG. 2 is a circuit diagram of the conventional data output buffer.

Referring to FIG. 2, the data output buffer 110 includes a pre-driver 201 and a driver 202. The pre-driver 201 determines a logic state of the output data. In case where the data is not outputted, the pre-driver 201 makes the driver 202 maintain a high impedance (Hi-Z). Here, a driving voltage VDDQ is a high voltage and a ground voltage VSSQ is a low voltage.

If a logic low level and a logic high level are respectively inputted to an up data input terminal UP_data and a down data input terminal DN_data of the pre-driver 201, a logic high level and a logic low level are inputted to a gate of a PMOS transistor and a gate of an NMOS transistor contained in the driver 202. Thus, an output terminal of the data output buffer 110 maintains the high impedance that is not either a logic high level or a logic low level.

Meanwhile, if a logic high level is inputted to the up data input terminal UP_data and the down data input terminal DN_data of the pre-driver 201, a logic low level is inputted to the gate of the PMOS transistor and the gate of the NMOS transistor contained in the driver 202. Thus, a logic high level is outputted through the output terminal of the data output buffer 110. On the contrary, if a logic low level is inputted to the up data input terminal UP_data and the down data input terminal DN_data of the pre-driver 201, a logic high level is inputted to the gate of the PMOS transistor and the gate of the NMOS transistor of the driver 202. Thus, a logic low level is outputted through the output terminal of the data output buffer 110.

The data outputted from the data output buffer 110 can be outputted to an external input/output (I/O) pin 106. A slope of the signal outputted at that time is referred to as a slew rate. For example, if the slew rate is expressed as 3 V/ns, it means a velocity activated as much as 3 V for 1 ns.

The slew rate is determined by size of the transistors of the pre-driver 201 shown in FIG. 2. Although the slew rate can be determined in various manners, for example a size of a transistor and a resistor, a following description will be made with the transistor.

According to the prior art, the slew rate is given as a fixed value in design of the DRAM. Therefore, if the slew rate is high, a signal quality is degraded due to a bounce noise. On the contrary, if the slew rate is very low, a variation of an access time is so large that the signal quality is also degraded. Here, the signal quality may be a signal integrity. When a signal is outputted during a predetermined period, data occupying time and a data intersecting time are determined. A clause "the signal integrity is good means that a data occupying time is relatively long.

According to the prior art, however, the slew rate is given as the fixed value in design of the DRAM and thus the slew rate cannot be adjusted after designing DRAM products.

SUMMARY OF INVENTION

It is, therefore, an object of the present invention to provide a semiconductor memory device capable of adjusting a slew rate of a data signal outputted in response to a control signal, which is programmable at an exterior of the semiconductor memory device.

In accordance with a first embodiment of the present invention, a slew-rate adjusting apparatus for use in a semiconductor memory device includes: a slew-rate modulation signal generator for generating a slew-rate modulation signal according to the number of control codes having a first logic level among a plurality of control codes, which are programmable at an exterior; and a pre-driver for adjusting a slew rate of a data signal by changing the number of switching elements turned on in response to the slew-rate modulation signal.

The slew-rate modulation signal generator may include: a logic combination unit for combining logic levels of the control codes to output a control signal; and a switching unit for generating the slew-rate modulation signal used to adjust the number of the switching elements turned on in response to the control signal.

The pre-driver may include: an upper pre-driver having a plurality of switching elements connected in parallel with a ground voltage terminal; and a lower pre-driver having a plurality of switching elements connected in parallel with a driving voltage terminal.

In accordance with a second embodiment of the present invention, a slew-rate adjusting apparatus for use in a semiconductor memory device includes: a slew-rate modulation signal generator for generating a slew-rate modulation signal according to a plurality of control codes, which exclusively have a first logic level, wherein the control codes are programmable at an external; and a pre-driver for changing the number of switching elements turned on in response to the slew-rate modulation signal, thereby adjusting a slew rate of a data signal.

The slew-rate modulation signal generator may include: a logic combination unit for combining logic levels of the control codes; and a switching unit for generating the slew-rate modulation signal used to adjust the number of the switching elements turned on in response to the control signal.

The pre-driver may include: an upper pre-driver having a plurality of switching elements connected in parallel with a ground voltage terminal; and a lower pre-driver having a plurality of switching elements connected in parallel with a driving voltage terminal.

In accordance with a third embodiment of the present invention, a slew-rate adjusting apparatus for use in a semiconductor memory device includes: a slew-rate modulation signal generator for generating a slew-rate modulation signal according to a plurality of control codes, which exclusively have a first logic level, wherein the control codes are programmable at an external; and a pre-driver for adjusting a slew rate of a data signal according to the number of switching elements turned on in response to the slew-rate modulation signal.

The slew-rate modulation signal generator may include: a logic level changing unit for changing logic levels of the control codes and outputting a control signal; and a switching unit for generating the slew-rate modulation signal used to select the switching elements turned on in response to the control signal.

The pre-driver may include: an upper pre-driver having a plurality of switching elements connected in parallel with a ground voltage terminal; and a lower pre-driver having a plurality of switching elements connected in parallel with a driving voltage terminal.

In accordance with a fourth embodiment of the present invention, a slew-rate adjusting apparatus for use in a semiconductor memory device includes: a slew-rate modulation signal generator for generating a slew-rate modulation signal according to a plurality of control codes and inverted signals of the control codes, wherein the control codes are programmable at an external; and a pre-driver for changing the number of switching elements turned on in response to the slew-rate modulation signal, thereby adjusting a slew rate of a data signal.

The slew-rate modulation signal generator may include a plurality of inverters for inverting the plurality of the control codes.

The pre-driver may include: an upper pre-driver for adjusting a slew rate of an upper data signal in response to the plurality of the control codes; and a lower pre-driver for adjusting a slew rate of a lower data signal in response to output signals of the plurality of the inverters.

The upper pre-driver may include: a first resistor group having a plurality of resistors connected in series; and a first switching element group controlled by the plurality of control codes and connected in parallel with the resistors of the first resistor group.

In accordance with a fifth embodiment of the present invention, a slew-rate adjusting apparatus for use in a semiconductor memory device includes: a slew-rate modulation signal generator for generating a slew-rate modulation signal according to a plurality of control codes and inverted signals of the control codes, wherein the control codes are programmable at an exterior; and a pre-driver for adjusting a slew rate of a data signal according to size of switching elements turned on in response to the slew-rate modulation signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a slew rate adjusting circuit for use in a semiconductor device in accordance with the present invention will be described in detail referring to the accompanying drawings.

Figure 1:
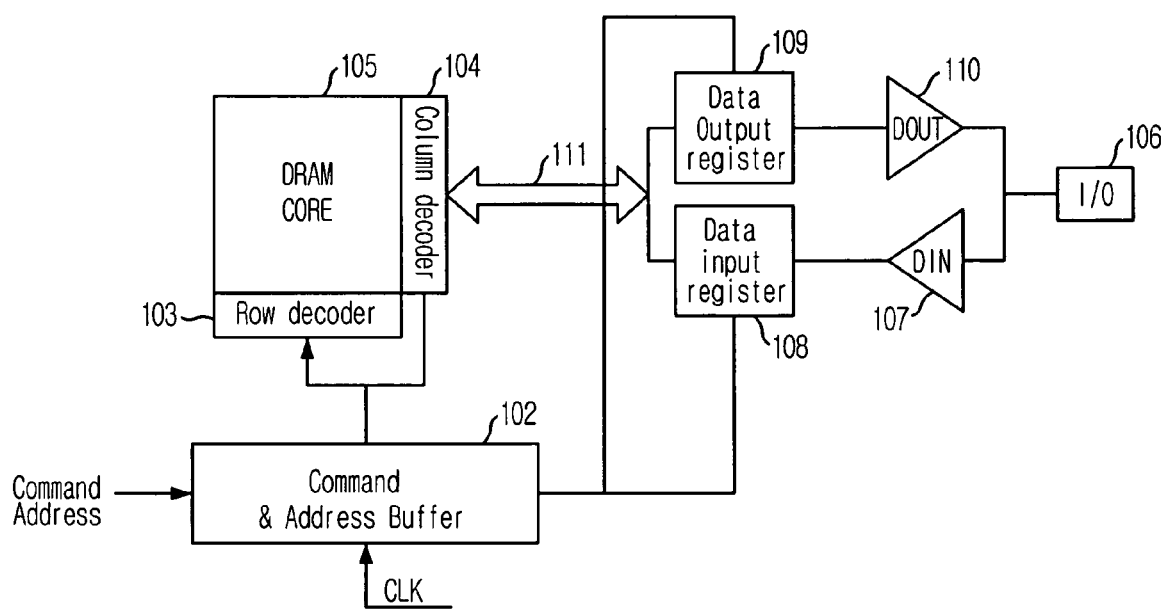
FIG. 1 is a block diagram of a conventional semiconductor memory device.
Figure 2:
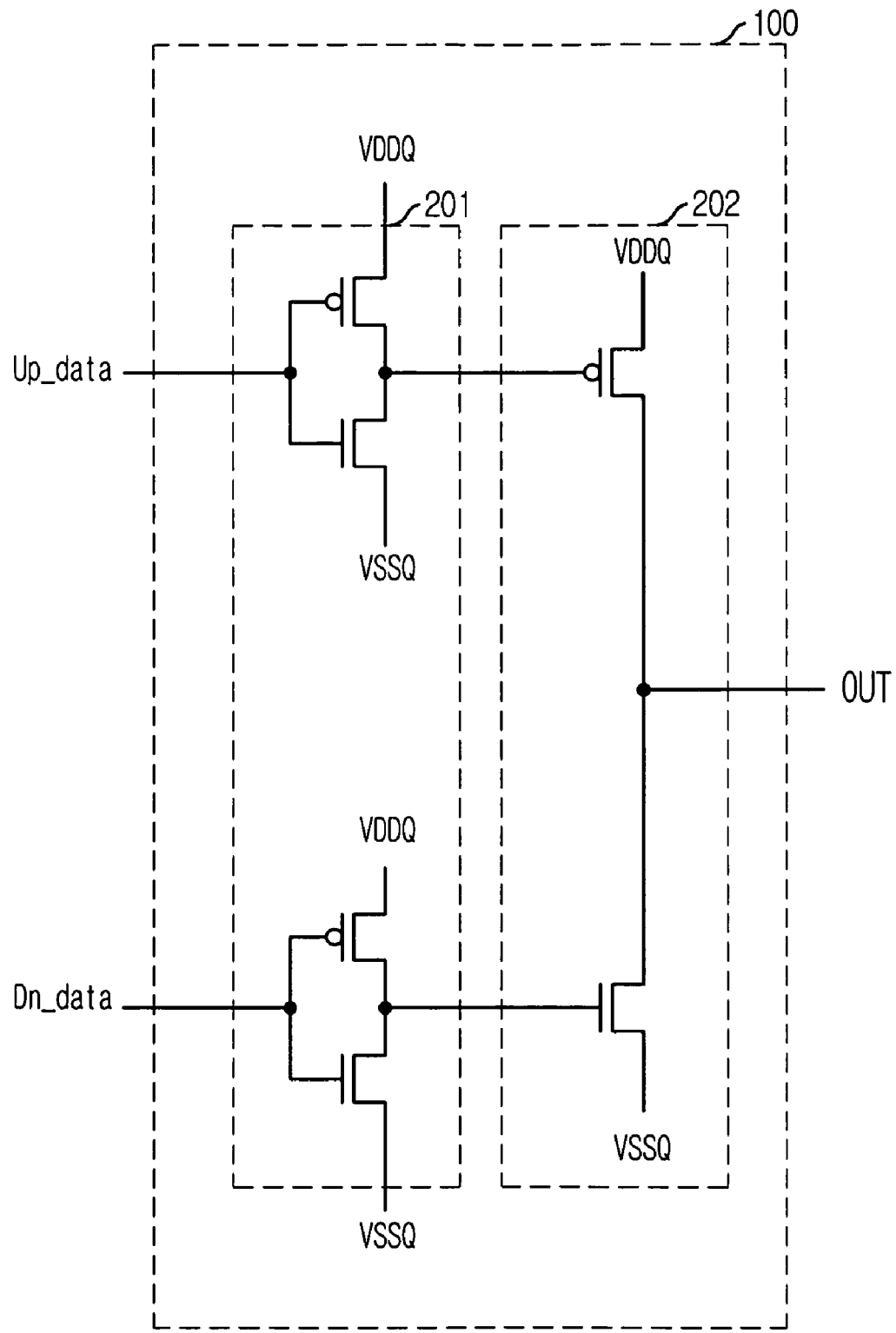
FIG. 2 is a circuit diagram of a data output buffer shown in FIG. 1.
Figure 3:
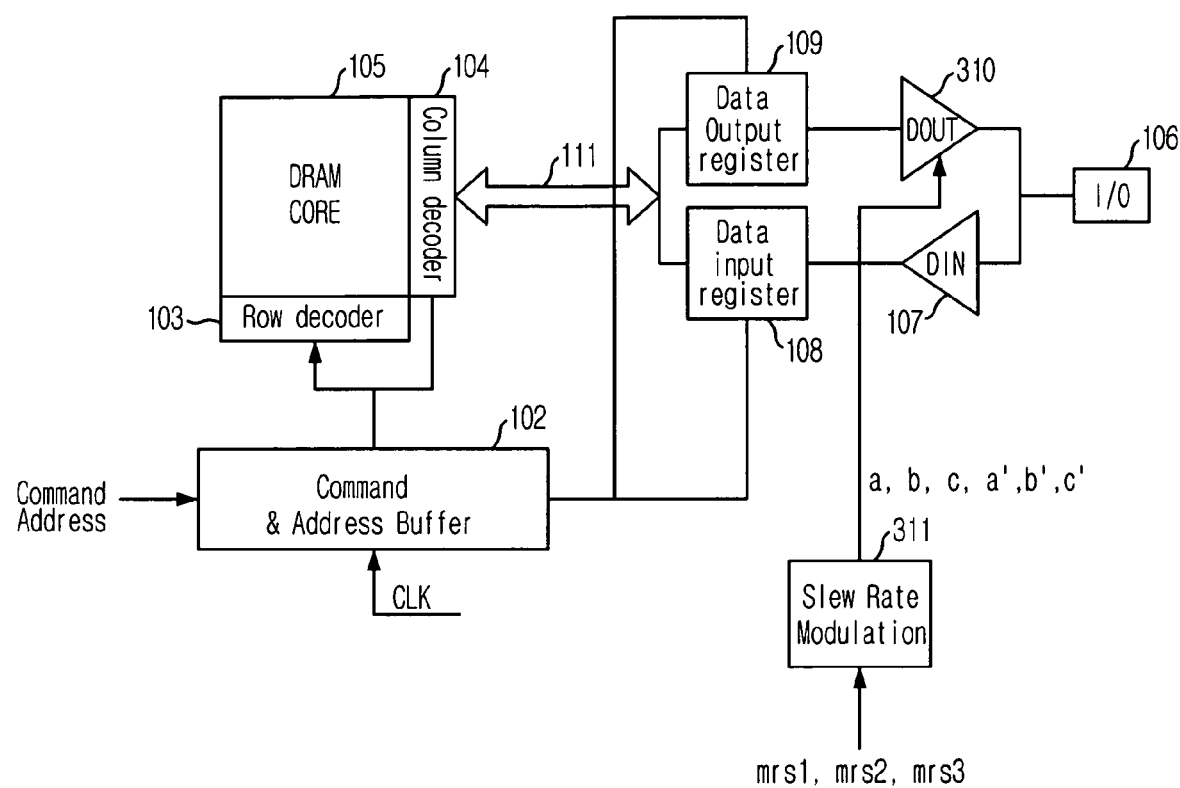
FIG. 3 is a block diagram of a semiconductor memory device in accordance with the present invention.
Figure 5:
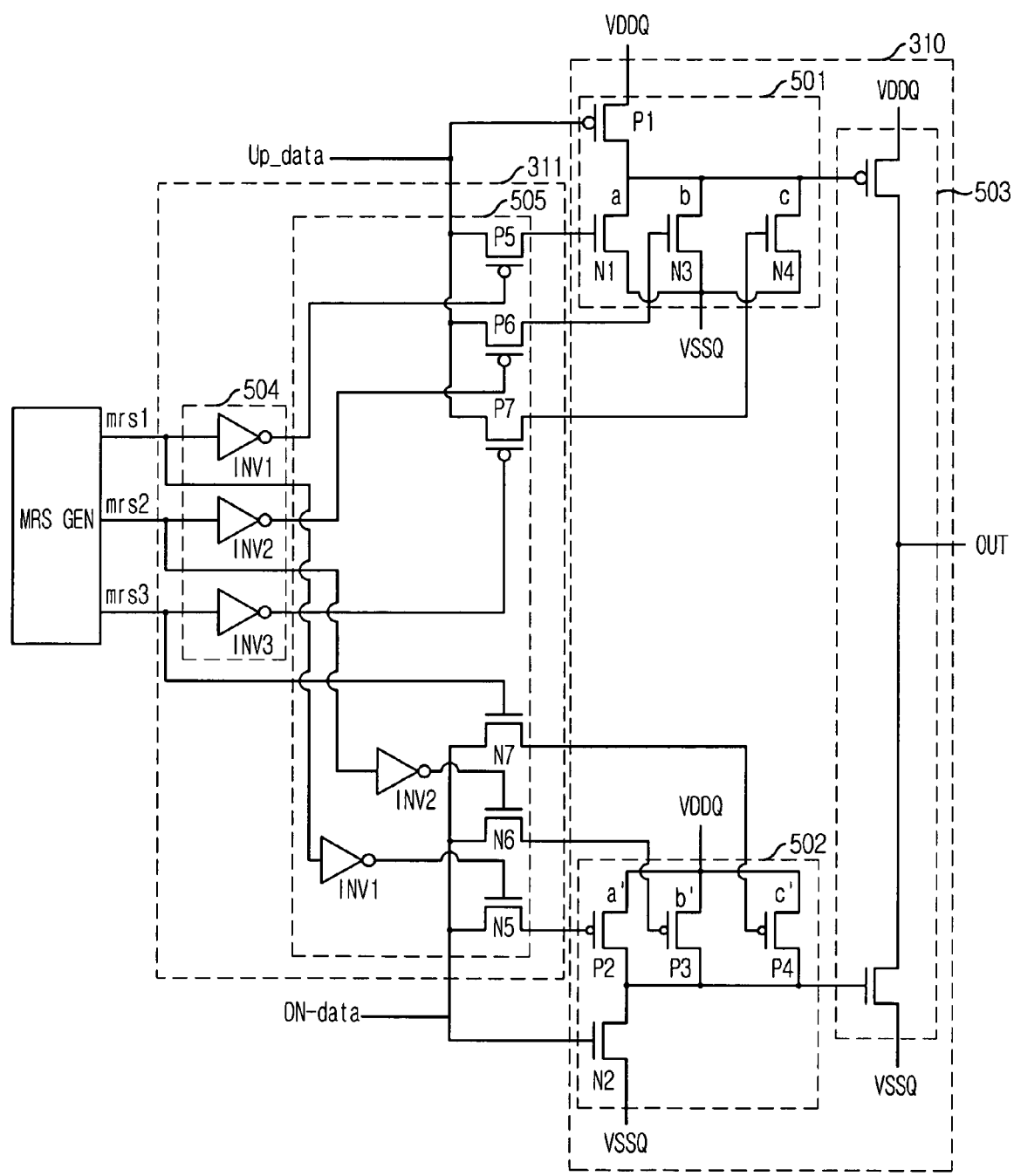
FIG. 5 is a circuit diagram of a data output buffer and a slew-rate modulation signal generator in accordance with another embodiment of the present invention.
Figure 6:
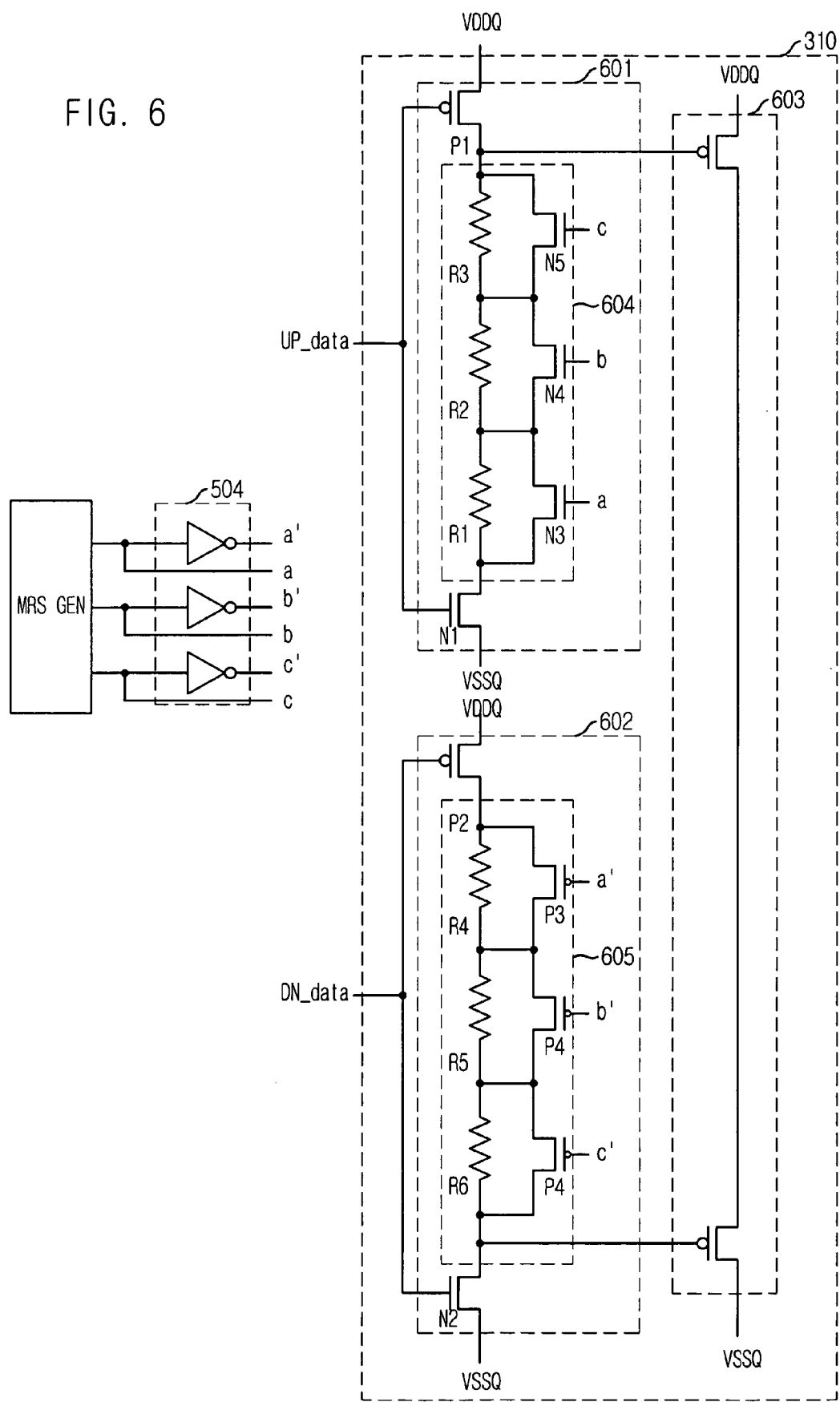
FIG. 6 is a circuit diagram of a data output buffer and a slew-rate modulation signal generator in accordance with a further another embodiment of the present invention.

FIG. 3 is a block diagram of a semiconductor memory device in accordance with the present invention. An entire configuration is almost equal to that of the conventional semiconductor memory device shown in FIG. 1. A difference is that a slew-rate modulation signal generator 311 is further included. In addition, a detailed configuration of a data output buffer 310 is different from the prior art. The slew-rate modulation signal generator 311 generates a slew-rate modulation signal according to a control code, which is programmable at an exterior. A pre-driver 401 of the data output buffer 310 changes the number of switching elements that are turned on in response to the slew-rate modulation signal, thereby adjusting the slew rate of a data signal. Alternatively, although the number of the turned-on switching elements in the pre-driver 401 is equal, an amount of current passing through one switching element is changed to thereby adjust the slew rate of the data signal. Although the embodiments of the present invention are shown in FIGS. 4 to 6, it is apparent that the present invention is not limited to them.

Figure 4:
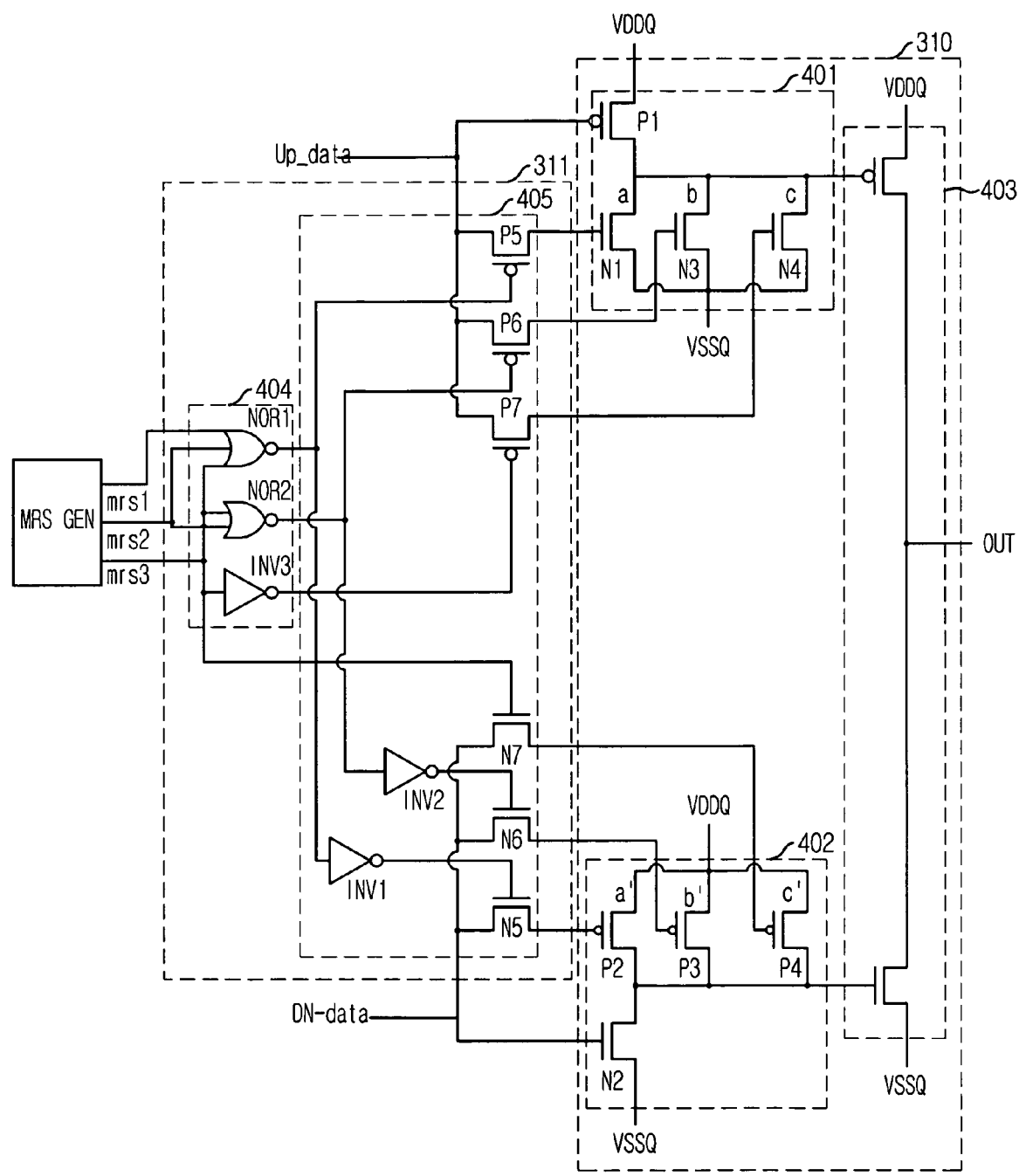
FIG. 4 is a circuit diagram of a data output buffer and a slew-rate modulation signal generator shown in FIG. 3 in accordance with an embodiment of the present invention.

FIG. 4 is a circuit diagram of a data output buffer and a slew-rate modulation signal generator shown in FIG. 3 in accordance with an embodiment of the present invention. In this embodiment, slew-rate modulation signals are inputted to upper and lower pre-drivers 401 and 402, and the number of switching elements that are turned on in response to a slew-rate modulation signal is changed, thereby adjusting the slew rate.

Referring to FIG. 4, the slew-rate modulation signal generator 311 in accordance with an embodiment of the present invention includes a logic combination unit 404 and a modulation switching unit 405.

The logic combination unit 404 combines logic states of first to third control codes, which are programmable at an exterior of the semiconductor memory device, and outputs a control signal. The modulation switching unit 405 outputs a slew-rate modulation signal to adjust the number of switching elements that are turned on in response to the control signal.

The logic combination unit 404 includes a first NOR gate NOR1 receiving the first to third control codes, a second NOR gate receiving the second and third control codes, and an inverter INV3 for inverting the third control code.

The switching unit 405 includes a first PMOS transistor P5 turned on in response to an output of the first NOR gate NOR1, a second PMOS transistor P6 turned on in response to an output of the second NOR gate NOR2, a third PMOS transistor turned on in response to an output of the inverter INV3, a first NMOS transistor N5 turned on in response to an inverted output of the first NOR gate NOR1, a second NMOS transistor N6 turned on in response to an inverted output of the first NOR gate NOR1, and a third NMOS transistor N7 turned on in response to the third control code.

The upper pre-driver 401 changes the turning-on number of the switching elements N1, N2 and N3 according to the number of the activated slew-rate modulation signals a, b and c.

Meanwhile, the lower pre-driver 402 changes the turning-on number of the switching elements P2, P3 and P4 according to the number of activated slew modulation signals a', b' and c'.

For example, when the first to third control codes mrs1, mrs2 and mrs3 from a mode register state generator (MRS GEN) are changed to logic high levels, the slew-rate modulation signal generator 311 activates the slew-rate modulation signals a and b, a' and b', c and c'.

The first to third control codes mrs1, mrs2 and mrs3 can be inputted in a manner that they are sequentially changed to the logic high level. Alternatively, the first to third control codes mrs1, mrs2 and mrs3 can be inputted in a manner that they are exclusively changed to the logic high level. However, the present invention is not limited to it.

For example, if the first control code mrs1 is set to a logic high level, the first PMOS transistor P5 of the switching unit 405 is turned on so that the switching element N1 of the upper pre-driver 401 is turned on. Also, the first NMOS transistor N5 is turned on so that the switching element P2 of the lower pre-driver 402 is turned on.

If the third control code rms3 is set to a logic high level, all the first to third PMOS transistors P5, P6 and P7 of the switching unit 405 are turned on so that the switching elements N1, N3 and N4 of the upper pre-driver 401 are turned on. Also, all the first to third NMOS transistors N5, N6 and N7 are turned on so that the switching elements P2, P3 and P4 of the lower pre-driver 402 are turned on.

Here, the upper pre-driver 401 is configured with a plurality of slew-rate modulation switching elements at a ground terminal side. The reason is that the ground voltage of the upper pre-driver 401 is used to output a logic high level to the output terminal OUT by turning on the PMOS transistor of the driver 403. Meanwhile, the driving voltage of the lower pre-driver 402 is sued to output a logic low level to the output terminal OUT by turning on the NMOS transistor of the driver 403. For these reasons, the lower pre-driver 402 is configured with a plurality of switching elements for the modulation of the slew rate.

Consequently, the turning-on number of the switching elements N1, N3 and N4 of the upper pre-driver 401 and the turning-on number of the switching elements P2, P3 and P4 of the lower pre-driver 402 are changed according to the logic state of the first to third control codes mrs1, mrs2 and mrs3, thereby adjusting the slew rate of the data signal.

FIG. 5 is a circuit diagram of a data output buffer and a slew-rate modulation signal generator in accordance with another embodiment of the present invention. An entire configuration is almost equal to that of the semiconductor memory device shown in FIG. 4. However, detailed configurations of a logic combination unit 504 and a switching unit 505 are different.

The logic combination unit 504 includes a first inverter INV1 for inverting a first control code mrs1, a second inverter INV2 for inverting a second control code mrs2, and a third inverter INV3 for inverting a third control code mrs3.

The switching unit 505 includes a first PMOS transistor P5 turned on in response to an output of the first inverter INV1, a second PMOS transistor P6 turned on in response to an output of the second inverter INV2, a third PMOS transistor P7 turned on in response to an output of the third inverter INV3, a first NMOS transistor N5 turned on in response to the first control code mrs1, a second NMOS transistor N6 turned on in response to the second control code mrs2, and a third NMOS transistor N7 turned on in response to the third control code mrs3.

The first to third control codes mrs1, mrs2 and mrs3 can be changed to logic high levels. In this case, sizes of the switching elements contained in upper and lower pre-drivers 501 and 502 need to be identical to one another.

In this embodiment, the turning-on number of the switching elements N1, N2 and N3 of the upper pre-driver 501 is changed according to the number of the activated slew-rate modulation signals a, b and c outputted from the switching unit 505. This operation is identical to the embodiment of FIG. 4.

Also, the turning-on number of the switching elements P2, P3 and P4 of the lower pre-driver 502 is changed according to the number of activated slew modulation signals a', b' and c' outputted from the switching unit 505.

Meanwhile, the first to third control codes mrs1, mrs2 and mrs3 can be inputted in a manner that they are exclusively changed to the logic high levels. In this case, the switching elements of the upper pre-driver 501 and the lower pre-driver 502 need to be different in size.

FIG. 6 is a circuit diagram of a data output buffer and a slew-rate modulation signal generator shown in FIG. 3 in accordance with a further another embodiment of the present invention.

In this embodiment, the slew-rate modulation signal generator 311 can be simply configured with only three inverters. An upper slew-rate adjusting unit 604 of an upper pre-driver 601 includes a plurality of resistors R1, R2 and R3 connected to in series to determine a slew rate of a data signal. A lower slew-rate adjusting unit 605 of a lower pre-driver 602 includes a plurality of resistors R4, R5 and R6 connected in series to determine a slew rate of a data signal.

Here, as shown in FIG. 6, the serially connected resistors R1, R2 and R3 of the upper slew-rate adjusting unit 604 are individually connected in parallel with switching elements N3, N4 and N5, which are controlled by slew-rate modulation signals a, b and c outputted from the slew-rate modulation signal generator 311.

An operation of the upper pre-driver 601 will be described below in brief. A resistance between a PMOS transistor P1 and an NMOS transistor N1 of the upper pre-driver 601 is determined according to the switching operation of the switching elements N3, N4 and N5. That is, as the resistance is larger, the slew rate is decreased, and as the resistance is small, the slew rate is increased.

The resistance can be changed in various methods.

One method is to sequentially change the first to third control codes mrs1, mrs2 and mrs 3 to logic high levels. This method can be implemented by making the serially connected resistors R1, R2 and R3 of the upper slew-rate adjusting unit 604 with the same size as one another. For example, if only the first control code mrs1 is turned on, a resistance between the PMOS transistor P1 and the NMOS transistor N1 of the upper pre-driver 601 is R2+R3. Meanwhile, if the first to third control codes mrs1, mrs2 and mrs3 are turned on, the resistance between the PMOS transistor P1 and the NMOS transistor N1 is zero. Therefore, serially connected resistors are added or the resistance is dependent on a resistance of the PMOS transistor P1 and the NMOS transistor N1.

Another method is to exclusively change the first to third control codes mrs1, mrs2 and mrs3 to logic high levels. This method can be implemented by making the serially connected resistors R1, R2 and R3 of the upper slew-rate adjusting unit 604 with different size from one another. For example, if the first control code mrs1 is turned on, the resistance between the PMOS transistor P1 and the NMOS transistor N1 of the upper pre-driver 601 is R2+R3. If the second control code mrs2 is turned on, the resistance between the PMOS transistor P1 and the NMOS transistor N1 is R1+R3. In this manner, their combination can also be different by changing the resistance.

Since a configuration and operation of the lower slew-rate adjusting unit 605 are similar to those of the upper slew-rate adjusting unit 604, a description thereof will be omitted.

Although each of the upper pre-driver 601 and the lower pre-driver 602 uses three switching elements, the present invention is not limited to it. That is, if necessary, the number of the switching elements may be increased or decreased.

In addition, although the first to third control codes are outputted from the mode register set generator (MRS GEN), the present invention is not limited to it. That is, the control codes may be inputted from an external chipset or directly inputted from a central processing unit (CPU).

According to the present invention, even when the signal integrity of the data output signal is not uniform due to a processing difference or a high speed of the semiconductor memory device, the slew rate of the data output signal can be adjusted in a software fashion by using a programmable signal, thereby obtaining an optimum signal integrity.

The present application contains subject matter related to Korean patent application No. 2004-26252, filed in the Korean Patent Office on Apr. 16, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A slew-rate adjusting apparatus for use in a semiconductor memory device, comprising:
  a slew-rate modulation signal generator for generating slew-rate modulation signals according to a data signal and the number of control codes, wherein the slew-rate modulation signal generator includes a logic combination unit for combining logic levels of the control codes to output control signals and a switching unit for receiving the data signal and the control signals to generate the slew-rate modulation signals used to adjust a number of switching elements; and
  a pre-driver for adjusting a slew rate of an output by changing the number of the switching elements turned on by the slew-rate modulation signals and the data signal.

2. The slew-rate adjusting apparatus as recited in claim 1, wherein the pre-driver includes:
  an upper pre-driver having a plurality of switching elements connected in parallel with a ground voltage terminal; and
  a lower pre-driver having a plurality of switching elements connected in parallel with a driving voltage terminal.

3. The slew-rate adjusting apparatus as recited in claim 2, wherein the plurality of switching elements included in the upper pre-driver have the same size.

4. The slew-rate adjusting apparatus as recited in claim 1, wherein the logic combination unit includes:
  a first NOR gate receiving first to third control codes;
  a second NOR gate receiving the second and third control codes; and
  an inverter receiving the third control code.

5. The slew-rate adjusting apparatus as recited in claim 4, wherein the switching unit includes:
  a first PMOS transistor configured to be turned on in response to an output of the first NOR gate;
  a second PMOS transistor configured to be turned on in response to an output of the second NOR gate;
  a third PMOS transistor configured to be turned on in response to an output of the inverter;
  a first NMOS transistor configured to be turned on in response to an inverted output of the first NOR gate;
  a second NMOS transistor configured to be turned on in response to an inverted output of the second NOR gate; and
  a third NMOS transistor configured to be turned on in response to the third control code.

6. The slew-rate adjusting apparatus as recited in claim 1, wherein the logic combination unit includes:
  a first inverter for inverting a first control code;
  a second inverter for inverting a second control code; and
  a third inverter for inverting a third control code.

7. The slew-rate adjusting apparatus as recited in claim 6, wherein the switching unit includes:
  a first PMOS transistor configured to be turned on in response to an output of the first inverter;
  a second PMOS transistor configured to be turned on in response to an output of the second inverter;
  a third PMOS transistor configured to be turned on in response to an output of the third inverter;
  a first NMOS transistor configured to be turned on in response to the first control code;
  a second NMOS transistor configured to be turned on in response to the second control code; and
  a third NMOS transistor configured to be turned on in response to the third control code.

8. The slew-rate adjusting apparatus as recited in claim 1, wherein the number of the control codes is the number of the control codes having a first logic level among a plurality of control codes, which are programmable at an exterior.

9. The slew-rate adjusting apparatus as recited in claim 1, wherein the data signal is transmitted to be the slew-rate modulation signals according to the control signals.

10. The slew-rate adjusting apparatus as recited in claim 2, wherein the upper pre-driver further includes:
a switching element configured to be turned on by the data signal.

11. The slew-rate adjusting apparatus as recited in claim 2, wherein the lower pre-driver further includes:
a switching element configured to be turned on by the data signal.

12. A slew-rate adjusting apparatus for use in a semiconductor memory device, comprising:
a slew-rate modulation signal generator for generating slew-rate modulation signals according to a data signal and a plurality of control codes, which exclusively have a first logic level, wherein the control codes are programmable at an external, wherein the slew-rate modulation signal generator includes a logic combination unit for combining logic levels of the control codes to output control signals and a switching unit for receiving the data signal and the control signals to generate the slew-rate modulation signals used to adjust a number of switching elements; and
a pre-driver for changing the number of the switching elements turned on by the slew-rate modulation signals and the data signal, thereby adjusting a slew rate of an output.

13. The slew-rate adjusting apparatus as recited in claim 12, wherein the pre-driver includes:
an upper pre-driver having a plurality of switching elements connected in parallel with a ground voltage terminal; and
a lower pre-driver having a plurality of switching elements connected in parallel with a driving voltage terminal.

14. The slew-rate adjusting apparatus as recited in claim 13, wherein the plurality of switching elements included in the upper pre-driver have the same size.

15. The slew-rate adjusting apparatus as recited in claim 12, wherein the logic combination unit includes:

a first NOR gate receiving first to third control codes;
a second NOR gate receiving the second and third control codes; and
an inverter receiving the third control code.

16. The slew-rate adjusting apparatus as recited in claim 15, wherein the switching unit includes:
a first PMOS transistor configured to be turned on in response to an output of the first NOR gate;
a second PMOS transistor configured to be turned on in response to an output of the second NOR gate;
a third PMOS transistor configured to be turned on in response to an output of the inverter;
a first NMOS transistor configured to be turned on in response to an inverted output of the first NOR gate;
a second NMOS transistor configured to be turned on in response to an inverted output of the second NOR gate; and
a third NMOS transistor configured to be turned on in response to the third control code.

17. The slew-rate adjusting apparatus as recited in claim 12, wherein the data is transmitted to be the slew-rate modulation signals according to the control signals.

18. The slew-rate adjusting apparatus as recited in claim 13, wherein the upper pre-driver further includes:
a switching element configured to be turned on in response to the data signal.

19. The slew-rate adjusting apparatus as recited in claim 13, wherein the lower pre-driver further includes:
a switching element configured to be turned on in response to the data signal.

20. A slew-rate adjusting apparatus for use in a semiconductor memory device, comprising:
a logic combination unit for combining logic levels of control codes to output control codes;
a switching unit for transmitting a data signal to be used to adjust a number of switching elements according to the control signals; and
a pre-driver for adjusting a slew rate of an output by changing the number of the switching elements turned on by the transmitted data signal.

* * * * *